US010923644B2

United States Patent
Lee et al.

(10) Patent No.: US 10,923,644 B2
(45) Date of Patent: Feb. 16, 2021

(54) EMBEDDED ELECTRODE SUBSTRATE FOR TRANSPARENT LIGHT EMITTING DEVICE DISPLAY AND METHOD FOR MANUFACTURING THEREOF

(71) Applicant: LG CHEM, LTD., Seoul (KR)

(72) Inventors: Kiseok Lee, Daejeon (KR); Kun Seok Lee, Daejeon (KR); Yong Goo Son, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/643,466

(22) PCT Filed: Aug. 20, 2019

(86) PCT No.: PCT/KR2019/010548
§ 371 (c)(1),
(2) Date: Feb. 28, 2020

(87) PCT Pub. No.: WO2020/040518
PCT Pub. Date: Feb. 27, 2020

(65) Prior Publication Data
US 2020/0365784 A1   Nov. 19, 2020

(30) Foreign Application Priority Data
Aug. 20, 2018  (KR) .................. 10-2018-0096601

(51) Int. Cl.
*H01L 33/62*  (2010.01)
*H01L 25/075*  (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ................. H01L 33/62; H01L 25/0753; H01L 2933/0066; H01L 21/4846
See application file for complete search history.

(56) References Cited

U.S. PATENT DOCUMENTS

| 10,727,373 B2* | 7/2020 | Yokote .................. H01L 33/54 |
| 2003/0116770 A1 | 6/2003 | Chang et al. |
| 2009/0091916 A1 | 4/2009 | Matsuzaki et al. |

(Continued)

FOREIGN PATENT DOCUMENTS

| JP | 2008024887 | 2/2008 |
| JP | 2010021480 | 1/2010 |

(Continued)

*Primary Examiner* — Victor A Mandala
(74) *Attorney, Agent, or Firm* — Dentons US LLP

(57) ABSTRACT

An embedded electrode substrate for a transparent light emitting device display that includes a transparent substrate; an adhesive layer provided on the transparent substrate; and a wiring electrode portion and a light emitting device mounted portion embedded in the adhesive layer, and the wiring electrode portion comprises a first metal foil pattern, and comprises a blackening layer on both an upper surface and a side surface of the first metal foil pattern, and the light emitting device mounted portion comprises a second metal foil pattern and comprises the blackening layer only on the side surface of the second metal foil pattern.

16 Claims, 10 Drawing Sheets

(56) References Cited

U.S. PATENT DOCUMENTS

| | | | |
|---|---|---|---|
| 2009/0126984 A1* | 5/2009 | Saneto | H05K 9/0096 |
| | | | 174/350 |
| 2009/0133922 A1 | 5/2009 | Okazaki et al. | |
| 2010/0258752 A1* | 10/2010 | Mochizuki | B32B 5/147 |
| | | | 250/515.1 |
| 2012/0218318 A1 | 8/2012 | Hirao et al. | |
| 2014/0027164 A1 | 1/2014 | Liu et al. | |
| 2014/0295127 A1 | 10/2014 | Tang et al. | |
| 2016/0245491 A1 | 8/2016 | Kim et al. | |
| 2016/0293811 A1* | 10/2016 | Hussell | H01L 27/156 |
| 2017/0102808 A1 | 4/2017 | Goto et al. | |
| 2017/0142841 A1 | 5/2017 | Stay et al. | |
| 2018/0013093 A1 | 1/2018 | Park et al. | |
| 2019/0035979 A1* | 1/2019 | Yokote | H01L 33/54 |
| 2019/0044036 A1* | 2/2019 | Pan | H01L 33/505 |

FOREIGN PATENT DOCUMENTS

| | | |
|---|---|---|
| JP | 2011096975 | 5/2011 |
| JP | 2014-027275 | 2/2014 |
| JP | 2016197668 | 11/2016 |
| JP | 2017-045855 | 3/2017 |
| JP | 2017211826 | 11/2017 |
| KR | 20040081225 | 9/2004 |
| KR | 20090019387 | 2/2009 |
| KR | 101422270 | 7/2014 |
| KR | 20150115954 | 10/2015 |
| KR | 10-2016-0103818 | 9/2016 |
| KR | 20180006549 | 1/2018 |
| WO | 2012-011491 | 1/2012 |

\* cited by examiner

[Figure 1]
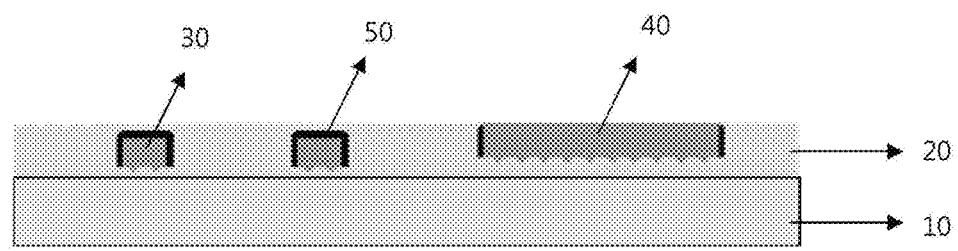

[Figure 2]
1) Forming metal foil pattern
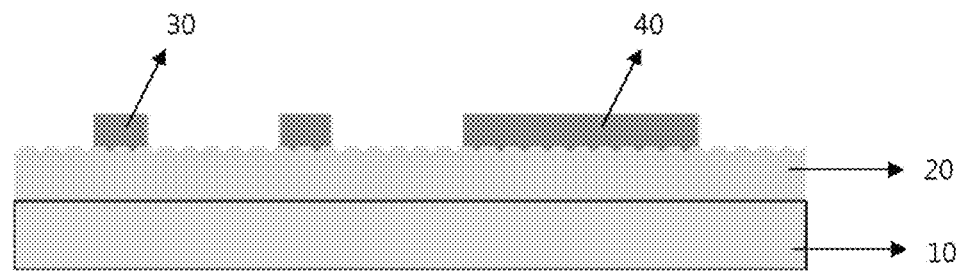
2) Forming blackening layer
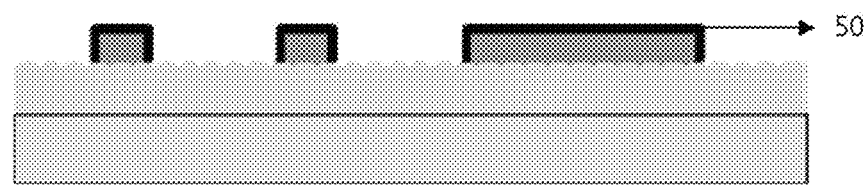
3) Embedding metal foil pattern into adhesive layer
4) Removing blackening layer provided on upper surface of second metal foil pattern

[Figure 3]
A. <Result of observing bubbles in adhesive layer>
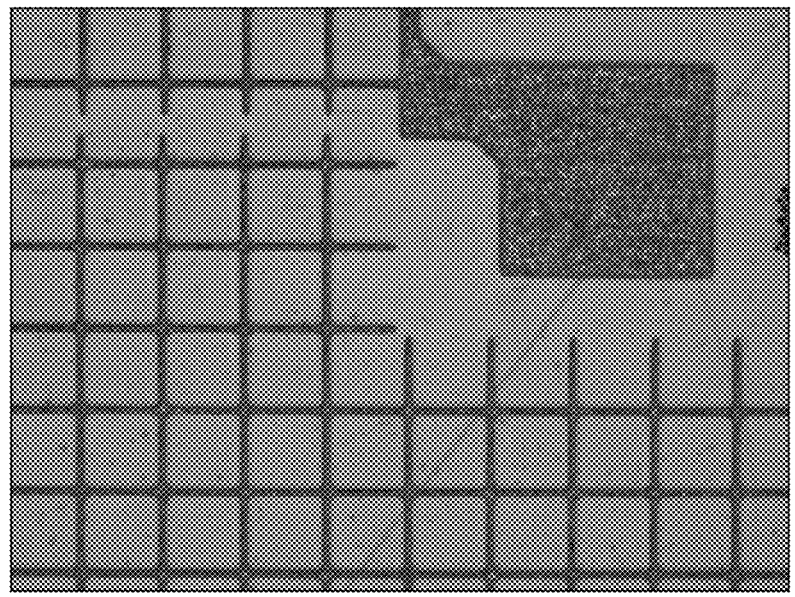
B. <Result of observing metal pattern cross portion>
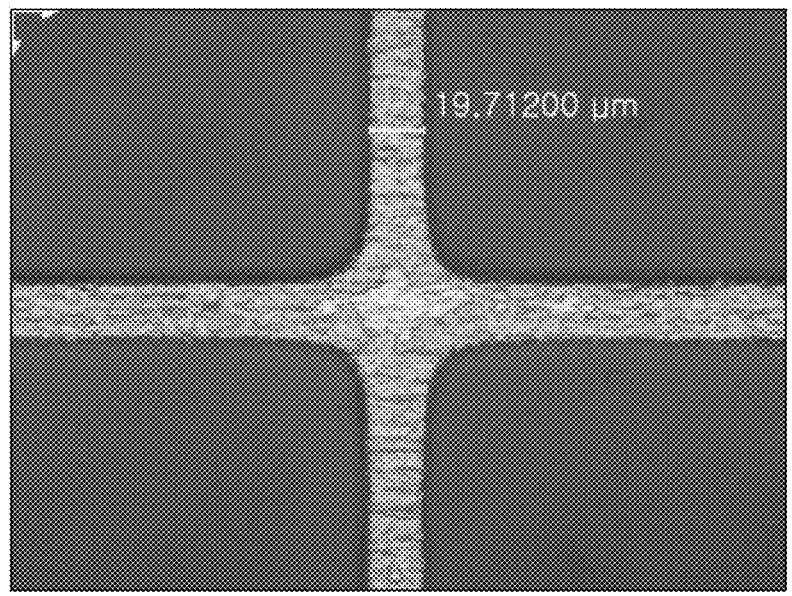

[Figure 4]
A. <Result of observing bubbles in adhesive layer>
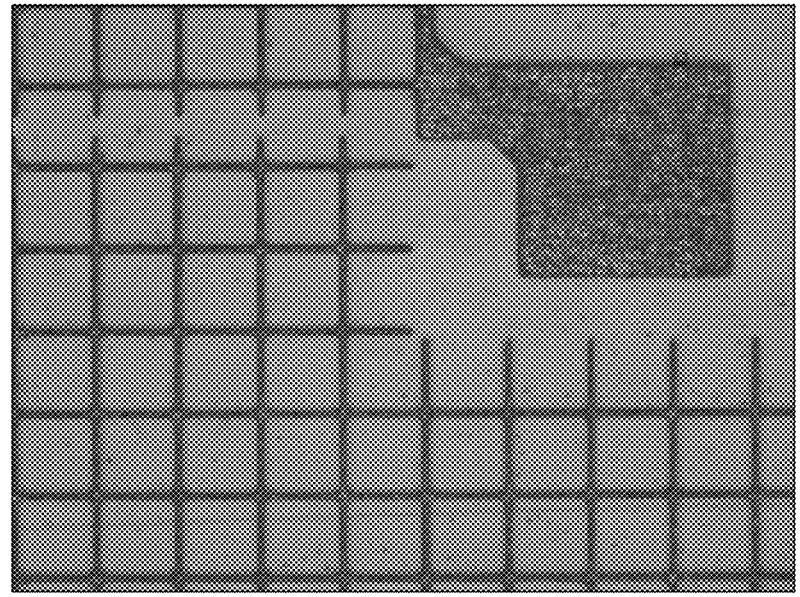
B. <Result of observing metal pattern cross portion>
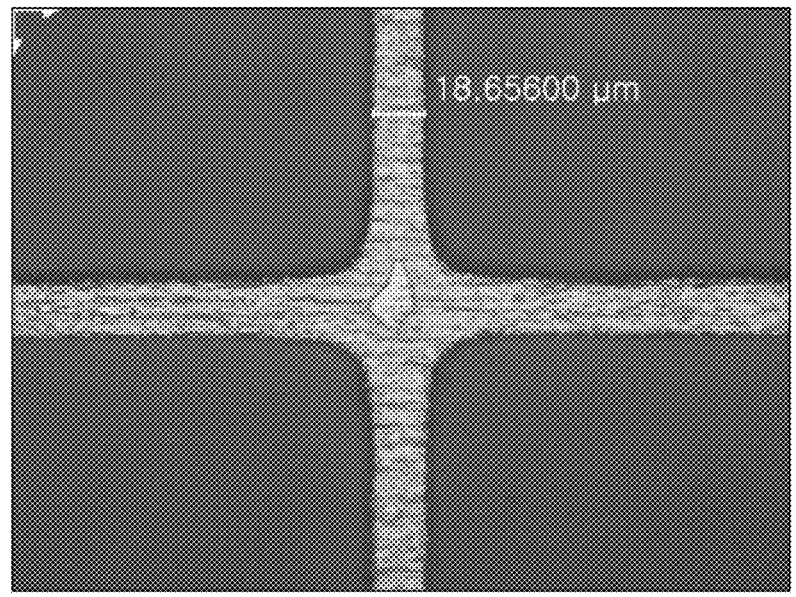

[Figure 5]
A. <Pencil hardness, 4B>
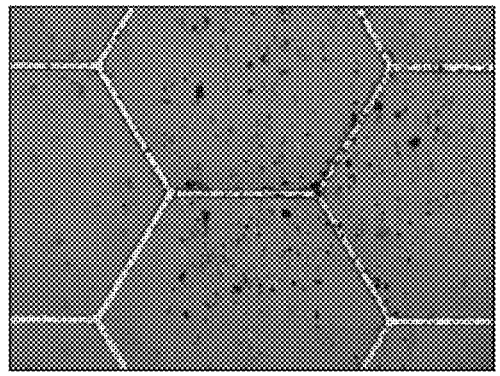
B. <Pencil hardness, 2B>
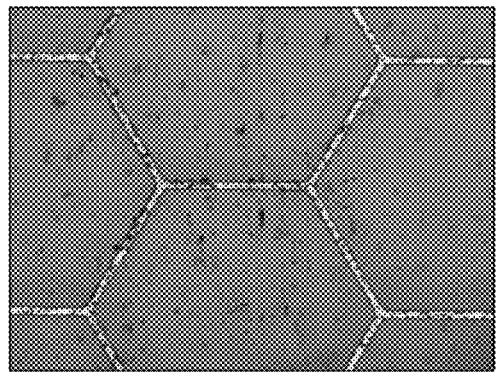
C. <Pencil hardness, HB>
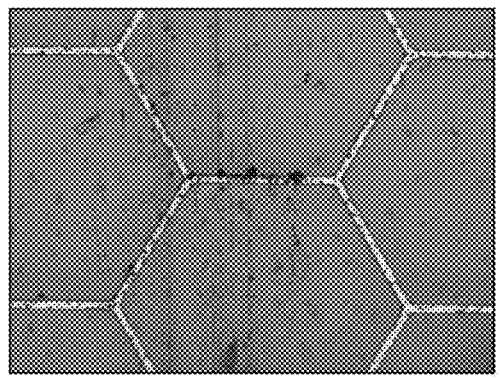

[Figure 6]
A. <Pencil hardness, 4B>
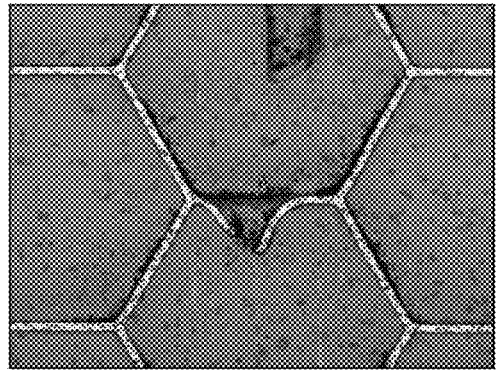
B. <Pencil hardness, 2B>
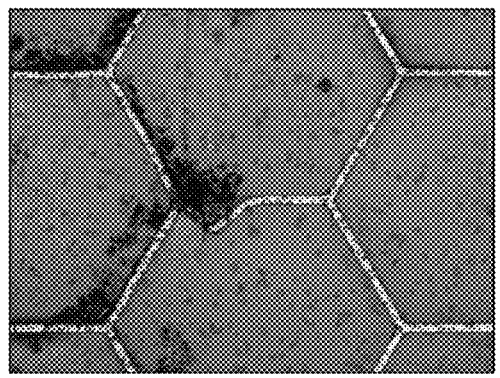
C. <Pencil hardness, HB>
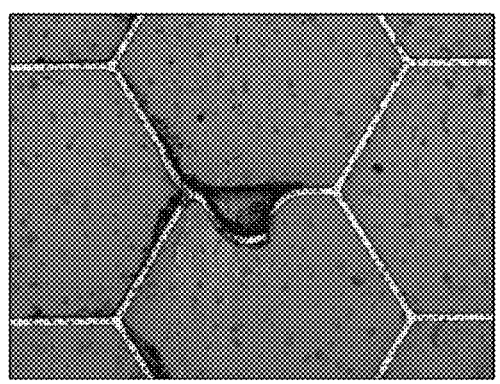

[Figure 7]
A. <Pattern shape>
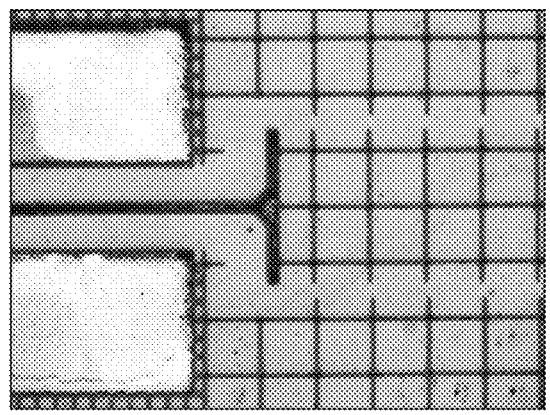
B. <Solder reflow shape>
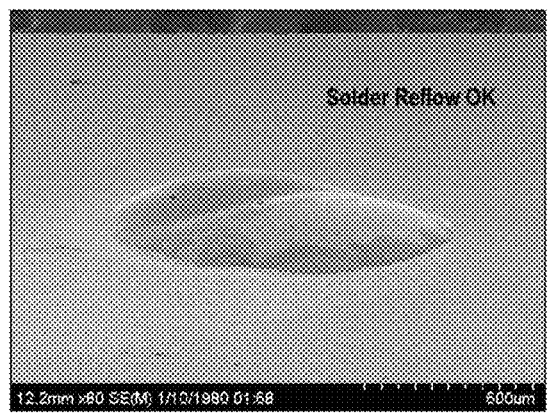
C.
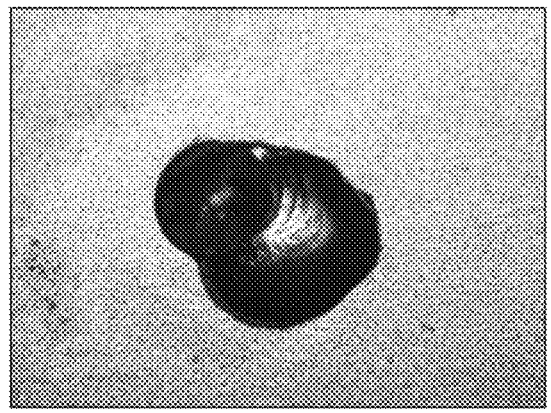

[Figure 8]
A. <Pattern shape>
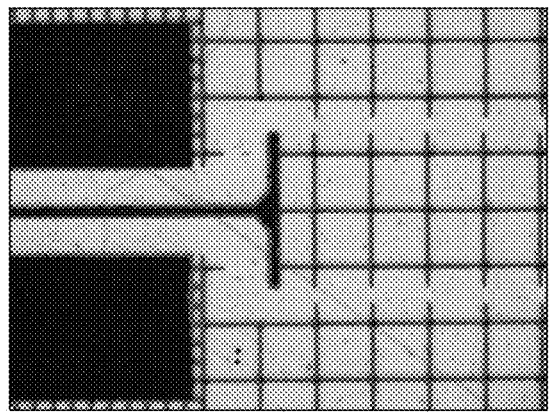
B. <Solder reflow shape>
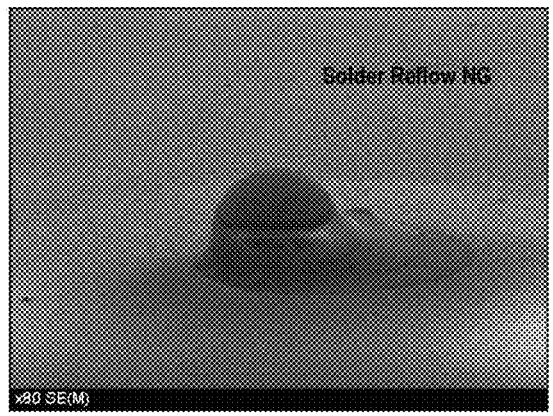
C.
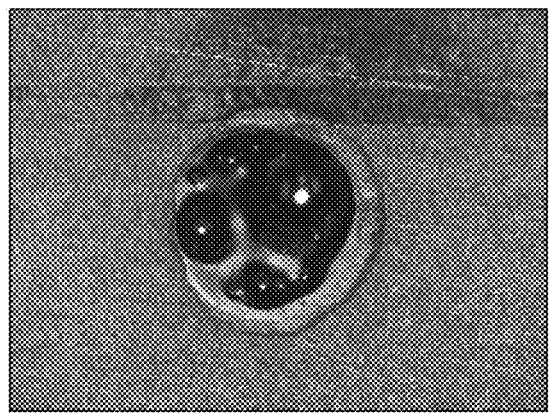

[Figure 9]
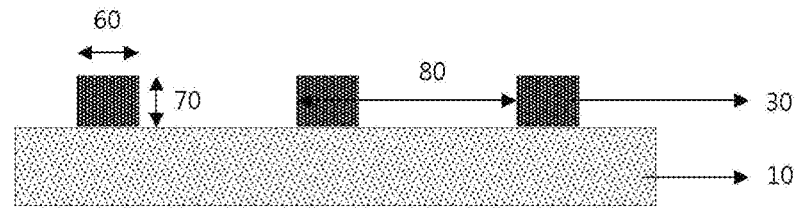
[Figure 10]
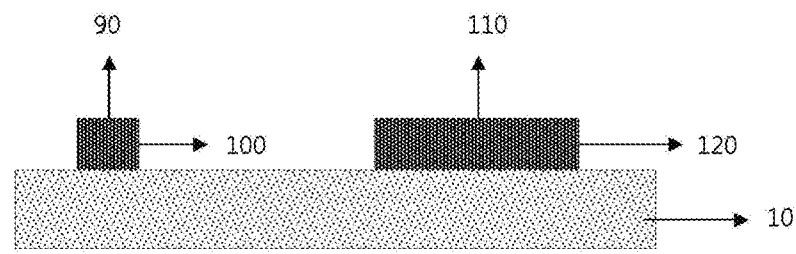
[Figure 11]
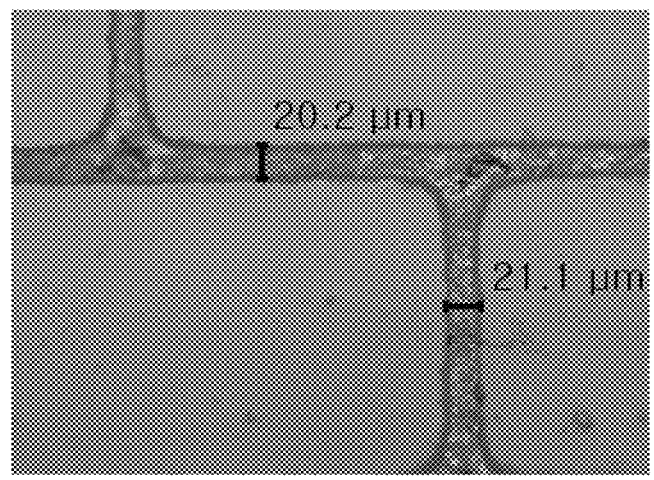

[Figure 12]
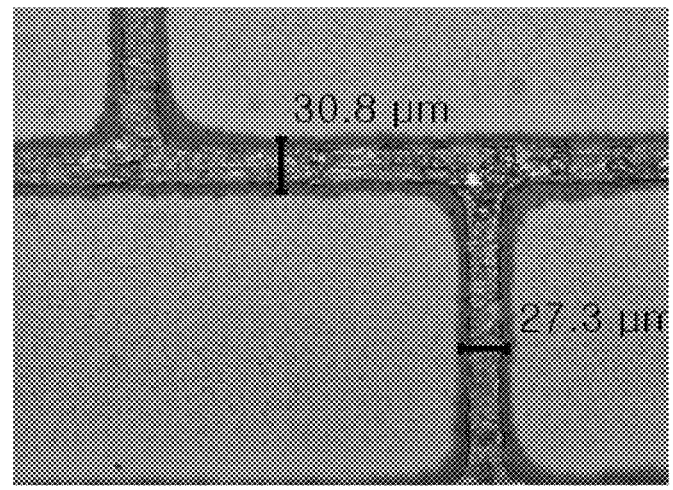
[Figure 13]
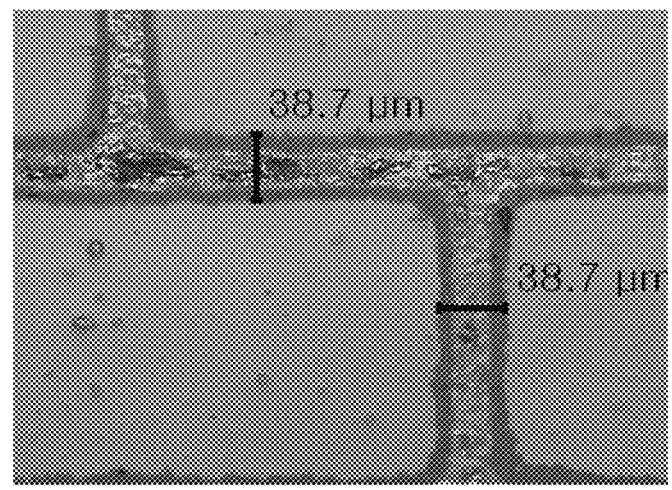

EMBEDDED ELECTRODE SUBSTRATE FOR TRANSPARENT LIGHT EMITTING DEVICE DISPLAY AND METHOD FOR MANUFACTURING THEREOF

CROSS-REFERENCE TO RELATED APPLICATIONS

This application is a National Stage Application of International Application No. PCT/KR2019/010548 filed on Aug. 20, 2019, which claims priority to and the benefit of Korean Patent Application No. 10-2018-0096601 filed in the Korean Intellectual Property Office on Aug. 20, 2018, the entire contents of which are incorporated herein by reference.

TECHNICAL FIELD

This application relates to an embedded electrode substrate for a transparent light emitting device display and a method for manufacturing thereof.

BACKGROUND

Recently in Korea, only colorful signs and a variety of outdoor lighting are produced in parks and downtown through the fusion of advanced ICT technologies and LED technologies to provide information and attractions to citizens. In particular, a transparent LED display using an ITO transparent electrode material in which an LED is applied between glass and glass or a transparent film adopting the LED is attached on one surface of the glass can produce luxurious effects by invisible wires. As a result, the transparent LED is used for an interior design in hotels, department stores, etc., and has a growing importance in implementing media facades of exterior walls of buildings.

A demand for a transparent electrode which is transparent and is electrically charged and is used for a touch screen explosively increases as smart devices are spreading and a transparent electrode which is most commonly used among the transparent electrodes is indium tin oxide (ITO) which is an oxide of indium and tin. However, indium which is a main raw material of an ITO transparent electrode material is not a lot in reserves over the world, is produced only in some countries comprising China, and the like, and has high production cost. Further, a resistance value is not constantly applied to the ITO, and as a result, expressed LED light does not express desired luminance and is not constant. As a result, the transparent LED utilizing the ITO is a limit in being used as a transparent electrode material having high performance and low cost.

It is true that the ITO as the transparent electrode material has been used while occupying a largest portion, but research and technology development utilizing a new material is continuously made due to a limit in economy and limited performance. A transparent electrode material that is attracting attention as a next-generation new material can comprise metal mesh (Mesh Metal), a nanowire (Ag nanowire), carbon nanotubes (CNT), a conductive polymer, graphene, and the like. Among them, the metal mesh as a new material which occupies 85% of materials to replace the ITO has low cost and high conductivity, and as a result, a market of the metal mesh has been expanded in terms of utilization.

The transparent LED display utilizing the metal mesh is easier in maintenance, shows resource saving and environmental contamination prevention, and is economical due to reduction of manufacturing cost compared with the existing ITO transparent display. Further, the transparent LED display can be expanded and applied for various uses, and as a result, there is a possibility in applying and utilizing the transparent LED display to and for various products as a new transparent electrode material.

BRIEF DESCRIPTION

Technical Problem

This application has been made in an effort to provide an embedded electrode substrate for a transparent light emitting device display and a method for manufacturing thereof.

Technical Solution

An embodiment of this application provides an embedded electrode substrate for a transparent light emitting device display, comprising: a transparent substrate; an adhesive layer provided on the transparent substrate; and a wiring electrode portion and a light emitting device mounted portion embedded in the adhesive layer, in which the wiring electrode portion comprises a first metal foil pattern and comprises a blackening layer on both an upper surface and a side surface of the first metal foil pattern, and the light emitting device mounted portion comprises a second metal foil pattern and comprises the blackening layer only on the side surface of the second metal foil pattern.

Further, another embodiment of this application provides a method for manufacturing an embedded electrode substrate for a transparent light emitting device display, comprising: forming a structure comprising a transparent substrate, an adhesive layer provided on the transparent substrate, and a metal foil provided on the adhesive layer; forming a wiring electrode portion comprising a first metal foil pattern and a light emitting device mounted portion comprising a second metal foil pattern by patterning the metal foil; forming a blackening layer on both upper surfaces and side surfaces of the first and second metal foil patterns; embedding the first and second metal foil patterns into the adhesive layer by heat-treating a structure comprising the blackening layer at a temperature of 70° C. to 100° C. and exposing the upper surface of the second metal foil pattern; and removing the blackening layer provided on the upper surface of the second metal foil pattern.

Further, yet another embodiment of this application provides a transparent light emitting device display comprising an embedded electrode substrate for a light emitting device display.

Advantageous Effects

According to an embodiment of this application, since a metal foil pattern is formed by using a low-cost metal foil, raw material cost can be saved at the time of manufacturing an electrode substrate for a transparent light emitting device display. In particular, according to an embodiment of this application, the metal foil pattern is formed on an adhesive layer and then heat-treated at a temperature of 70° C. to 100° C. to manufacture an embedded electrode substrate in which the metal foil pattern is embedded in the adhesive layer.

Further, according to an embodiment of this application, the metal foil pattern is formed on the adhesive layer and then heat-treated at the temperature of 70° C. to 100° C. to prevent haze of an electrode substrate depending on illuminance of the surface of the metal foil from being increased.

In addition, according to an embodiment of this application, since a blackening layer is provided on both an upper surface and a side surface of a first metal foil pattern of a wiring electrode portion, visibility of the embedded electrode substrate for the transparent light emitting device display can be reduced.

Further, since the blackening layer is provided on both the upper surface and the side surface of the first metal foil pattern of the wiring electrode portion and is not provided on the upper surface of a second metal foil pattern of a light emitting device mounted portion, an attachment force of a solder provided on the light emitting device mounted portion is maintained at the time of manufacturing the transparent light emitting device display.

BRIEF DESCRIPTION OF DRAWINGS

FIG. 1 is a diagram schematically illustrating an embedded electrode substrate for a transparent light emitting device display according to an embodiment of this application.

FIG. 2 is a diagram schematically illustrating a method for manufacturing an embedded electrode substrate for a transparent light emitting device display according to an embodiment of this application.

FIGS. 3A and 3B, and FIGS. 4A and 4B are photographs illustrating embedding characteristics of electrode patterns depending on thicknesses of adhesive layers in Examples 1 and 2, respectively, as an embodiment of this application.

FIGS. 5A-5C and FIGS. 6A-6C are photographs illustrating a comparison of durability of electrode patterns in Example 1 and Comparative Example 1, respectively, as an embodiment of this application.

FIGS. 7A-7C and FIGS. 8A-8C are photographs illustrating a comparison of solder material reflow characteristics depending on whether there is a blackening layer in a light emitting device mounted portion according to Example 1 and Comparative Example 2, respectively as an embodiment of this application.

FIG. 9 is a diagram schematically illustrating a line width, a thickness, and a pitch of a first metal foil pattern according to an embodiment of this application.

FIG. 10 is a diagram schematically illustrating upper surfaces and side surfaces of first and second metal foil patterns according to an embodiment of this application.

FIGS. 11 to 13 are diagrams illustrating embedding characteristics of electrode patterns in Examples 3 to 5, respectively as an embodiment of this application.

EXPLANATION OF REFERENCE NUMERALS

10: Transparent substrate
20: Adhesive layer
30: Wiring electrode portion
40: Light emitting device mounted portion
50: Blackening layer
60: Line width of first metal foil pattern
70: Thickness of first metal foil pattern
80: Pitch of first metal foil pattern
90: Upper surface of first metal foil pattern
100: Side surface of first metal foil pattern
110: Upper surface of second metal foil pattern
120: Side surface of second metal foil pattern

DETAILED DESCRIPTION

Hereinafter, this application will be described in detail.
In this application, "transparent" is supposed to mean that the "transparent" has a transmission property of approximately 80% or more in a visible ray region (400 nm to 700 nm).

A transparent LED display provides various attractions to citizens through an information providing service and landscape rendering and a demand for the transparent LED display increases in various fields. Until now, it is true that ITO as a transparent electrode material has been used while occupying a largest portion, but research and technology development utilizing a new material is continuously made due to a limit in economy and limited performance.

More specifically, in implementing a transparent LED display in the related art, a transparent electrode wire is formed by introducing Ag nanowire or transparent metal oxide (ITO, IZO, etc.). However, since the Ag nanowire or transparent metal oxide (ITO, IZO, etc.) has a high resistance, there is a limit in the LED driving number, and as a result, there is a limit in increasing an area of the transparent LED display. Further, in order to lower resistance, when a thickness of the Ag nanowire or the transparent metal oxide increases, there is poor transmittance of the transparent LED display.

Therefore, in this application, a metal electrode is intended to be applied to an electrode substrate of a transparent light emitting device display in order to provide a transparent light emitting device display having a resistance characteristic and visibility which are excellent. When the metal electrode is applied, it is advantageous in that low resistance can be ensured, but appearance visibility increases due to an increase in reflectance and yellow index (YI). In order to suppress such a phenomenon, when a blackening layer is formed on the surface of the metal electrode, a problem in that an attachment force of a solder onto an LED mounted portion is lowered can occur.

Further, in the case of a transparent electrode substrate applied to the transparent LED display having the metal wire on a transparent substrate, transmittance of 70% or more and a sheet resistance characteristic of 0.5 ohm/sq or less need to be ensured. In order to ensure the transmittance and the sheet resistance characteristic, a copper deposition layer having low specific resistance needs to have a thickness of 1 μm or more. The copper deposition layer of 1 μm or more can be formed on the transparent substrate by using sputtering, evaporation, and plating processes, etc., but in this case, high deposition cost may be generated and lowering of the attachment force of the copper deposition layer and damage to a lower transparent substrate during a deposition process may occur.

Further, when a low-price copper foil and the transparent substrate are laminated by using an adhesive, manufacturing cost may be greatly reduced and the attachment force may be improved, but surface roughness of the copper foil is transferred to the surface of the adhesive, and as a result, haze of an opening increases.

Further, a metal pattern film for a general transparent electrode is manufactured by a scheme of selectively removing a transparent substrate with a metal film to a desired form. Therefore, a metal pattern formed on the transparent substrate has a height which is the same as the thickness of an initial metal film and has a structural limitation vulnerable to external shock. In order to solve such a problem, an embedded electrode substrate is proposed and when an electrical connection to the upper portion of the embedded electrode substrate is required, various available methods for manufacturing the metal pattern having a semi-embedding structure have been proposed.

Further, in order to manufacture an embedded electrode having excellent surface flatness, a method in which a resin layer is additionally applied onto the transparent substrate with an electrode pattern and then a residual resin layer which exists on the electrode is removed or the electrode pattern is formed on a release substrate and then the resin layer is applied and cured thereon and the electrode is transferred to the resin layer can be used, but in this case, a process is complicated and the manufacturing cost increases.

In the metal pattern film based transparent electrode substrate, a metal specific color sense and high reflectance increase pattern visibility to cause a foreign body sensation, thereby introducing a blackening surface treatment for reducing the foreign body sensation. When the device is mounted on the electrode substrate, an attachment layer which can be electrically connected is applied by using the solder and heat is not sufficiently transferred to a solder material on the blackening layer, and as a result, it is impossible to mount the device. Accordingly, it is necessary to selectively remove the blackening layer from the light emitting device mounted portion.

A selective blackening method in the related is proposed, but blackening is impossible after embedding the metal pattern, and as a result, a method for embedding the pattern after selective blackening or selectively removing blackening after embedding the pattern is required.

Therefore, in this application, an embedded electrode substrate for a transparent light emitting device display is intended to be provided, in which resistance characteristics and visibility can be excellent and a solder attachment force on the LED mounted portion can be maintained.

An embedded electrode substrate for a transparent light emitting device display according to an embodiment of this application comprises: a transparent substrate; an adhesive layer provided on the transparent substrate; and a wiring electrode portion and a light emitting device mounted portion embedded in the adhesive layer and the wiring electrode portion comprises a first metal foil pattern and comprises a blackening layer on both an upper surface and a side surface of the first metal foil pattern, and the light emitting device mounted portion comprises a second metal foil pattern and comprises the blackening layer only on the side surface of the second metal foil pattern.

In an embodiment of this application, the transparent substrate can be a glass substrate or a transparent plastic substrate having excellent transparency, surface smoothness, ease of handling, and waterproofness, but is not limited thereto and is not limited as long as it is a transparent substrate ordinarily used in an electronic device. Specifically, the transparent substrate can be made of glass; urethane resin; polyimide resin; polyester resin; (meta)acrylate-based polymer resin; and polyolefin-based resin such as polyethylene or polypropylene. Further, the transparent substrate can be a film having visible ray transmittance of 80% or more, such as polyethylene terephthalate (PET), cyclic olefin polymer (COP), polyethylene naphthalate (PEN), polyethersulfone (PES), polycarbonate (PC), acetyl celluloid, etc. The thickness of the transparent substrate can be a 25 μm to 250 μm, but is not limited thereto only.

In an embodiment of this application, the adhesive layer can have a refractive index of 1.45 to 1.55 and have a fluidity at a temperature of 70° C. or more.

In this application, the refractive index of the adhesive layer can be measured by a prism coupler (equipment example—2010/M of Metricon Inc.), ellipsometer (equipment example—UVISEL of Horriba Scientific Inc.), Abbe Refractometer (equipment example—AR4 of Kruss Inc.), etc. For example, the refractive index can be calculated by measuring a change in the amount of light reflected on a coating layer by using the prism coupler. More specifically, a material of which refractive index is to be measured is coated on glass or other substrates having known refractive indexes with a thickness of several μm by a method such as spin coating, etc., and a coated sample is brought into contact with a prism. Thereafter, when a laser is incident on the prism, most of the laser is fully reflected, but when a specific incident angle and a condition are satisfied, an attenuation wave (evanescent field) is generated on an interface, and as a result, light is coupled. When an angle at which the intensity of light detected by a detector suddenly decreases due to occurrence of coupling is measured, the prism coupler can automatically calculate the refractive index of the adhesive layer from a parameter related to a polarization mode of the light and the refractive indexes of the prism and the substrate.

Further, the adhesive layer can comprise a heat-curable adhesive composition or a UV-curable adhesive composition. More specifically, the adhesive layer can comprise a silane-modified epoxy resin, a bisphenol A type phenoxy resin, an initiator and a silane coupling agent, but is not limited thereto only.

The adhesive layer can be formed by using the adhesive composition and by a method such as comma coating, slot die coating, etc., but is not limited thereto only.

The thickness of the adhesive layer can be at least 2.5 times or 2.5 to 5 times larger than the thickness of the first metal foil pattern. More specifically, the thickness of the adhesive layer can be 8 μm to 100 μm.

When a thickness range of the adhesive layer is satisfied, the first metal foil pattern constituting the wiring electrode portion can be fully embedded in an embedding process of the metal foil pattern provided on the adhesive layer and when the thickness of the adhesive layer is out of the thickness range of the adhesive layer, it is impossible to fully embed the wiring electrode portion or the fluidity of the adhesive layer is deepened and a pattern disconnection can be caused. More specifically, when the thickness of the adhesive layer is less than 2.5 times compared to the thickness of the first metal foil pattern, it is impossible to fully embed the first metal foil pattern and the blackening layer can be removed from the upper surface of the wiring electrode portion, and as a result, the visibility of the electrode increases and it is disadvantageous in terms of an appearance and bubbles are collected on the adhesive layer between the wiring electrode portions, resulting in a poor optical characteristic. Further, when the thickness of the adhesive layer exceeds 5 times compared with the thickness of the first metal foil pattern, the fluidity of the adhesive layer is deepened during an embedding process by a heat lamination process, and as a result, the disconnection of the wiring electrode portion pattern can be caused.

In an embodiment of this application, tenpoint average roughness Rz of the surface of the first metal foil pattern facing the transparent substrate can be more than 0.5 μm.

In an embodiment of this application, the wiring electrode portion can comprise a first common electrode wiring portion, a second common electrode wiring portion, and a signal electrode wiring portion. Further, all of the first common electrode wiring portion, the second common electrode wiring portion, and the signal electrode wiring portion can comprise a first metal foil pattern in which a line width, a line height, and a pitch are the same as each other and the first metal foil pattern can be provided in an entire region of an effective screen part on the transparent substrate except for the light emitting device mounted portion. In this application, the line height has the same meaning as the thickness.

In this application, a fact that the line widths of the first metal foil patterns are the same as each other means that a standard deviation of the line width is 20% or less, preferably 10% or less, and more preferably 5% or less. Further, in this application, a fact that the line heights of the first metal foil patterns are the same as each other means that the standard deviation of the line height is 10% or less, preferably 5% or less, and more preferably 2% or less. Further, in this application, a fact that the pitches of the first metal foil patterns are the same as each other means that the standard deviation of the pitch is 10% or less, preferably 5% or less, and more preferably 2% or less.

In an embodiment of this application, the first metal foil pattern can be provided in the entire region of the effective screen part on the transparent substrate except for a region where a light emitting device is provided. More specifically, the first metal foil pattern can be provided in a region having an area of 80% or more compared with the entire area on the transparent substrate or provided in an area of 99.5% or less. Further, the first metal foil pattern can be provided in a region having an area of 80% or more of an area except for an FPCB (flexible printed circuit board) pad portion region and a light emitting device pad portion region provided on the transparent substrate or provided in an area of 99.5% or less, based on the entire area of the transparent substrate. In this application, the FPCB pad portion region can comprise an FPCB pad portion for applying external power and the area can be a total area of the FPCB pad portion or more or three times or less the total area of the FPCB pad portion. Further, in this application, the light emitting device part portion region can comprise an electrode pad portion and the area can be 1.5 time or more of the total area of the electrode pad portion or 3 times or less of the total area of the electrode pad portion.

The signal electrode wiring portion can be provided between a first common electrode wiring portion and a second common electrode wiring portion.

In an embodiment of this application, the first common electrode wiring portion can be a (+) common electrode wiring portion and the second common electrode wiring portion can be a (−) common electrode wiring portion. Further, the first common electrode wiring portion can be the (−) common electrode wiring portion and the second common electrode wiring portion can be the (+) common electrode wiring portion.

In an embodiment of this application, a channel is formed in a structure in which the signal electrode wiring portion passes between the (+) common electrode wiring portion and the (−) common electrode wiring portion and the electrode wire does not separately come out for each light emitting device and can be connected to the (+) common electrode wiring portion and the (−) common electrode wiring portion as a common electrode.

The light emitting device mounted portion is a component provided at a location on which the light emitting device is mounted by using the solder and two or more light emitting device mounted portions can be provided on the transparent substrate and the number of light emitting devices can be appropriately selected by those skilled in the art by considering a use of the transparent light emitting device display and is not particularly limited. More specifically, the number of light emitting elements is associated with the resistance of the electrode, the electrode can sufficiently have low resistance and the larger the area of the display, the number of light emitting devices can increase. When the number of light emitting devices increases in the same area, the resolution becomes higher and when the number of light emitting devices increases at the same interval, the area of the display increases, and as a result, a wire line of a power supply unit can be reduced. Therefore, the number of light emitting devices can be appropriately selected by those skilled in the art by considering the use of the transparent light emitting device display.

In an embodiment of this application, the two or more light emitting devices can be connected to the signal electrode wiring portion in series and connected to the first common electrode wiring portion and the second common electrode wiring portion in series. The first common electrode wiring portion and the second common electrode wiring portion can provide a sufficient current amount to drive the light emitting device and in the case of sending a color signal of the light emitting device, the signal can be sent only with low current, and as a result, the first common electrode wiring portion and the second common electrode wiring portion can be connected to the signal electrode wiring portion in series. When the first common electrode wiring portion and the second common electrode wiring portion are connected to electrodes of the power supply unit in parallel, respectively other than a structure of this application for driving all light emitting devices and signals of all light emitting devices through each electrode, all of respective electrode widths need to be different from each other in order to adjust a resistance value depending on a layout distance of the light emitting device (the width of the electrode connected to the light emitting device which is most distant is largest) and it is difficult to configure an electrode having low resistance due to a spatial constraint of an electrode layout region due to a characteristic in which multiple light emitting devices are provided.

In an embodiment of this application, the first metal foil patterns of the first common electrode wiring portion, the second common electrode wiring portion, and the signal electrode wiring portion can be respectively separated from each other by a disconnection portion. The disconnection portion means a region in which a part of the first metal foil pattern is disconnected to break an electrical connection. The width of the disconnection portion can mean a distance among most adjacent ends of the first common electrode wiring portion, the second common electrode wiring portion, and the signal electrode wiring portion which are spaced apart from each other. The width of the disconnection portion can be 80 μm or less, 60 μm or less, 40 μm or less, or 30 μm, but is not limited thereto only. The width of the disconnection portion can be 5 μm or more.

According to an embodiment of this application, the width of the disconnection portion which respectively separates the first metal foil patterns of the first common electrode wiring portion, the second common electrode wiring portion, and the signal electrode wiring portion is minimized to lower awareness of the wiring.

In an embodiment of this application, the light emitting device mounted portion can comprise a second metal foil pattern and contain the same material as the first metal foil pattern.

The line width of the second metal foil pattern can be 100 μm or more or can be in the range of 100 μm to 1,000 μm, but is not limited only thereto.

In this application, the light emitting device mounted portion is a component provided at a location on which the light emitting device is mounted by using the solder and each light emitting device mounted portion can comprise at least four electrode pad portions electrically connected to the first common electrode wiring portion, the second common electrode wiring portion, and the signal electrode wiring portion. The at least four electrode pad portions can comprise two signal electrode pad portions, one first common electrode pad portion, and one second common electrode pad portion. Each of the two signal electrode pad portions can be provided at the end of the signal electrode wiring portion as a signal In-out pad portion of the light emitting device and the first common electrode pad portion and the second common electrode pad portion can be provided at the ends of the first common electrode wiring portion and the second common electrode wiring portion, respectively.

Further, the electrode pad portion can additionally comprise at least one capacitor pad portion on the transparent substrate. In an embodiment of this application, the electrode pad portion can comprise two capacitor pad portions. The capacitor pad portion is a pad to which a capacitor is attached and the capacitor can serve to stabilize current supplied to the light emitting device.

Each of the at least four electrode pad portions may not comprise a metal mesh pattern and the entire region of each pad portion can be made of metal. More specifically, since the electrode pad portion is a portion covered by the welded light emitting device, the electrode pad portion may not comprise the metal mesh pattern and the entire region of each pad portion can be made of metal.

Respective intervals among the at least four electrode pad portions can be in the range of 0.1 mm to 1 mm. The interval is provided to prevent a short circuit by considering a tolerance at the time of screen printing of a solder paste for forming the light emitting device afterwards.

The shapes of the electrode pad portion and the capacitor pad portion are not particularly limited and can be a rectangular shape. Further, the sizes of the electrode pad portion and the capacitor pad portion can be 0.1 mm² to 1 mm², but are not limited only thereto.

The four electrode pad portions can be joined to one light emitting device. That is, in an embodiment of this application, when multiple light emitting devices are provided on the transparent substrate, each light emitting device can be joined to four electrode pad portions.

In an embodiment of this application, the first metal foil pattern of the electrode pad portion can be the metal mesh pattern. As the metal mesh pattern, a pattern shape of the art can be used. More specifically, the metal mesh pattern can comprise polygonal patterns comprising one or more shapes among triangle, square, pentagon, hexagon, and octagon.

The metal mesh pattern can comprise a straight line, a curved line, or a closed curve line configured by the straight line or the curved line.

Since the first metal foil pattern is provided in the entire region of the effective screen part of the upper surface of the transparent substrate except for the region where the light emitting device mounted portion is provided, a maximum wiring region which is allowed can be ensured, and as a result, the resistance characteristic of the transparent light emitting device display can be improved. More specifically, sheet resistance of the first metal foil pattern can be 0.1 Ω/sq or less.

The pitch of the first metal foil pattern can be 100 μm to 1,000 μm or 100 μm to 600 μm and 100 μm to 300 μm, but the pitch can be adjusted according to transmittance or conductivity desired by those skilled in the art.

The material of the first metal foil pattern is not particularly limited, but preferably comprises at least one type of metal and a metal alloy. The first metal foil pattern can comprise gold, silver, aluminum, copper, neodymium, molybdenum, nickel, or an alloy thereof, but is not limited thereto only. In particular, the first metal foil pattern and the second metal foil pattern can comprise a copper foil pattern or an aluminum foil pattern.

The thickness of the first metal foil pattern is not particularly limited, but can be 3 μm or more or 3 μm to 20 μm in terms of the conductivity of the first metal foil pattern and an economic property of a forming process.

The line width of the first metal foil pattern can be 50 μm or less more, 30 μm or less, 25 μm or less, or 20 μm or less, but is not limited only thereto. The smaller the line width of the first metal foil pattern, it can be advantageous in terms of transmittance and wire awareness, but resistance reduction can be caused and in this case, when the thickness of the first metal foil pattern increases, the resistance reduction can be improved. The line width of the first metal foil pattern can be 5 μm or more.

An opening ratio of the first metal foil pattern, i.e., an area ratio not covered by the pattern can be 70% or more, 85% or more, or 95% or more.

According to an embodiment of this application, the first metal foil pattern in which the line width, the line height, and the pitch are the same is applied to the first common electrode wiring portion, the second common electrode wiring portion, and the signal electrode wiring portion to lower awareness of the wiring. When the line widths, the pitches, and the line heights of the first metal foil patterns of the first common electrode wiring portion, the second common electrode wiring portion, and the signal electrode wiring portion are not the same, the awareness of the wiring electrode portion can undesirably increase.

Further a line width 60, a thickness 70, and a pitch 80 of the first metal foil pattern according to an embodiment of this application are schematically illustrated in FIG. 9 below. The line width, the thickness, and the pitch of the first metal foil pattern can be measured by using a method known to the art. For example, a method for measuring the line width, the thickness, and the pitch by observing an SEM cross section, a method for measuring the line width, the thickness, and the pitch with a non-contact surface shape measurer (optical profiler), a method for measuring the line width, the thickness, and the pitch with a stylus surface step measurer (alpha step or surface profiler), etc., can be used. Further, the line width, the thickness, and the pitch can be measured by a micrometer or a thickness gauge.

Further, the upper surfaces and the side surfaces of the first and second metal foil patterns according to an embodiment of this application are schematically illustrated in FIG. 10 below.

According to an embodiment of this application, the first metal foil pattern of the wiring electrode portion comprises the blackening layer on both the upper surface and the side surface and the second metal foil pattern of the light emitting device mounted portion comprises the blackening layer only on the side surface. That is, the second metal foil pattern of the light emitting device mounted portion does not comprise the blackening layer on the upper surface. As described below, after the blackening layers are formed on both the upper surfaces and the side surfaces of the first and second metal foil patterns, the blackening layer formed on the upper surface of the second metal foil pattern can be selectively removed.

In an embodiment of this application, the line width of the first metal foil pattern can be 30 μm or less and the first metal foil pattern can have an embedding degree of 90% or more in the adhesive layer. In this application, the embedding degree can mean a ratio of an upper area of the first metal foil pattern embedded in the adhesive layer based on the entire upper area of the first metal foil pattern and the size of the area can be calculated through microscopic observation. The embedded upper area means an upper area in which the first metal foil pattern is not exposed.

In a pattern embedding process of a heat lamination scheme, the adhesive layer momentarily becomes a state close to a liquid phase, and as a result, the adhesive layer penetrates a release film and an upper interface of the metal foil pattern. In an embodiment of this application, at the time of the microscopic observation after the embedding process, it can be seen that the adhesive layer penetrates even the upper portion of the second metal foil pattern by approximately 30 μm to cover an outer perimeter of the pattern, but since the line width of the light emitting device mounted portion is 500 μm or more, the metal foil pattern is not fully embedded, but since the line width of the wiring electrode portion pattern is narrow as 20 μm or less, the wiring electrode portion can be fully embedded by the adhesive layer penetrating the upper portion of the electrode.

According to an embodiment of this application, the haze of a region in the embedded electrode substrate, which does not have the first and second metal foil patterns can be 3% or less.

The embedded electrode substrate for the transparent light emitting device display according to an embodiment of this application is schematically illustrated in FIG. 1 below. As illustrated in the following drawing, an embedded electrode substrate for a transparent light emitting device display according to an embodiment of this application comprises: a transparent substrate 10; an adhesive layer 20 provided on the transparent substrate 10; and a wiring electrode portion 30 and a light emitting device mounted portion 40 embedded in the adhesive layer 20 and the wiring electrode portion 30 comprises a first metal foil pattern and comprises a blackening layer 50 on both an upper surface and a side surface of the first metal foil pattern, and the light emitting device mounted portion 40 comprises a second metal foil pattern and comprises the blackening layer 50 only on the side surface of the second metal foil pattern.

A method for manufacturing an embedded electrode substrate for a transparent light emitting device display according to an embodiment of this application comprises: forming a structure comprising a transparent substrate, an adhesive layer provided on the transparent substrate, and a metal foil provided on the adhesive layer; forming a wiring electrode portion comprising a first metal foil pattern and a light emitting device mounted portion comprising a second metal foil pattern by patterning the metal foil; forming a blackening layer on both upper surfaces and side surfaces of the first and second metal foil patterns; embedding the first and second metal foil patterns into the adhesive layer by heat-treating a structure comprising the blackening layer at a temperature of 70° C. to 100° C. and exposing the upper surface of the second metal foil pattern; and removing the blackening layer provided on the upper surface of the second metal foil pattern.

In an embodiment of this application, the forming of the structure comprising the adhesive layer provided on the transparent substrate and the metal foil provided on the adhesive layer can comprise forming the adhesive layer on the metal foil and forming the transparent substrate on the adhesive layer, or forming the adhesive layer on the transparent substrate and forming the metal foil on the adhesive layer.

In an embodiment of this application, the forming of the wiring electrode portion comprising the first metal foil pattern and the light emitting device mounted portion comprising the second metal foil pattern by patterning the metal foil can adopt a method known to the art, e.g., a photolithography process. More specifically, the method for forming the first metal foil pattern and the second metal foil pattern can comprise forming a resist pattern on the metal foil and then etching the metal foil, and releasing the resist pattern, but is not limited only thereto.

The first and second metal foil patterns can be manufactured from a metal foil comprising at least one matt surface having relatively high tenpoint average roughness (Rz). In this case, the matt surface of the metal foil faces the transparent substrate.

In an embodiment of this application, the forming of the blackening layer can be performed by a plating process using a plating solution comprising at least one of copper, selenium, cobalt, nickel, manganese, magnesium, sodium, oxides thereof, and hydroxides thereof. The plating process can be an electrolytic plating process, an electroless plating process, etc.

In an embodiment of this application, the first metal foil pattern and the second metal foil pattern can be embedded into the adhesive layer by the heat-treating at the temperature of 70° C. to 100° C. In particular, according to an embodiment of this application, the embedded electrode substrate can be manufactured in which the first metal foil pattern and the second metal foil pattern are embedded into the adhesive layer through heat lamination with a film having excellent surface flatness, by the heat-treating at the temperature of 70° C. to 100° C.

In an embodiment of this application, the heat-treating at the temperature of 70° C. to 100° C. can be performed by a heat lamination process and in this case, the temperature of a lamination roll can be set to 70° C. to 100° C. In addition, a lamination speed can proceed at 0.3 m or more or to 1 m or less per minute. In particular, in an embodiment of this application, when the line width of the first metal foil pattern is 20 μm or less and the line width of the second metal foil pattern is 100 μm or more, a difference in embedding degree between the first and second metal foil patterns can be sufficient.

Further, the tenpoint average roughness (Rz) of the surface of the adhesive layer before the heat treating can be more than 0.5 μm and the tenpoint average roughness (Rz) of the surface of the adhesive layer after the heat treating can be 0.1 μm or less. Further, the tenpoint average roughness (Rz) of the surface of the adhesive layer before the heat treating can be more than 0.5 μm or less than 3 μm. Further, the tenpoint average roughness (Rz) of the surface of the adhesive layer after the heat treating can be more than 0 to 0.1 μm. When the Rz is 0.5 μm or less, the surface of the adhesive layer has unique high reflectance of the metal foil by low unevenness. Therefore, it is difficult to lower the reflectance of the transparent electrode substrate manufactured therefrom, so that it is a disadvantageous in that the pattern is easily recognized by an eye by the high reflectance. Further, when the Rz is 0.5 μm or less, the attachment force between the metal foil and the adhesive layer is lowered, and as a result, the metal foil pattern is released from the adhesive layer during a process of forming the metal foil pattern (photolithography process).

That is, when the adhesive layer is provided on the transparent substrate and then a low-price metal foil is laminated, the surface roughness of the metal foil is transferred to the surface of the adhesive layer, and as a result, the haze of a final product can increase. Therefore, according to an embodiment of this application, the metal foil pattern is formed on the adhesive layer and then heat-laminated with the film having excellent surface flatness at the temperature of 70° C. to 100° C. to prevent haze of a transparent electrode substrate depending on illuminance of the surface of the metal foil from being increased.

The method for manufacturing an embedded electrode substrate according to an embodiment of this application comprises fully curing the adhesive layer. The fully curing of the adhesive layer can comprise heat-curing the adhesive layer at a temperature of 120° C. or more or UV-curing the adhesive layer.

The method for manufacturing an embedded electrode substrate for a transparent light emitting device display according to an embodiment of this application is schematically illustrated in FIG. 2 below.

Further, an embodiment of this application provides a transparent light emitting device display comprising an embedded electrode substrate for a transparent light emitting device display.

The transparent light emitting device display can have a structure in which the solder is provided on the light emitting device mounted portion of the electrode substrate for the transparent light emitting device display and the light emitting device is provided on the solder. A method for manufacturing the transparent light emitting device display can adopt a method known to the art except for using the embedded electrode substrate for the transparent light emitting device display according this application.

EXAMPLES

Hereinafter, an embodiment disclosed in this specification will be described through Examples. However, scopes of the embodiments are not intended to be limited by the following Examples.

Example 1

A raw material used in this application which is generally a copper foil laminated film which is the same as the structure widely known as a Cu Clad laminated (CCL) was manufactured by forming an adhesive layer on a transparent substrate and then heat-laminating the adhesive layer with a copper foil. A coating solution for the adhesive layer was prepared by inputting a silane-modified epoxy resin, a bisphenol A epoxy resin, and a phenoxy resin at a weight ratio of 35:33:30, respectively and diluting the input resins with methyl ethyl ketone (MEK). The adhesive layer was formed with a thickness of 25 μm through comma coating of the prepared solution on a PET film having a thickness of 100 μm and a high-temperature drying process at 130° C. for 3 minutes. An LPF product of Iljin Materials Inc. has a matt surface having a nodule on one surface thereof so as to be advantageous in physical coupling of the copper foil (having a thickness of 8 μm) and the adhesive layer at the time of manufacturing the CCL and the surface was laminated at a speed of 1.0 m/min by using a roll laminator having a temperature of 100° C. so as to face the adhesive layer to manufacture a copper foil laminated film.

A dry film resist (DFR) was heat-laminated to an upper portion of the copper foil of the manufactured copper foil laminated film at the temperature of 100° C. and exposed with a light amount of 250 mJ/cm² of UV having a wavelength of 365 nm by using a negative-type photomask and a collimated light exposure device corresponding to first and second metal foil patterns. An uneven-structure metal pattern was formed on the upper portion of the adhesive layer through a wet process in which development, etching, and peeling were sequentially performed. All solutions used in respective processes were maintained at a room temperature. An aqueous solution of $Na_2CO_3$ 1.0 wt % was used as a development solution, and an etching solution was a mixed solution containing iron chloride and hydrochloric acid and a peeling solution was an aqueous solution of NaOH 2.0 wt %. A metal pattern film was immerged in a blacking solution to form a blackening layer on a patterned metal surface. As the blackening solution, an aqueous solution acquired by diluting YBM-100 of YMT Inc. at 10 wt % were used and the blackening solution was sprayed to the pattern film and this process was performed under a condition in which visible light average reflectance is less than 20%.

The metal pattern film and a release PET film (SLF050-060 of Optiver Korea Inc.) having a thickness of 50 μm were heat-laminated at a speed of 0.5 m/min by using the roll laminator of 100° C. for flattening the surface of the adhesive layer and embedding the surface of the adhesive layer into the adhesive layer of the metal pattern. UV curing was performed while the release film was laminated and the UV having the wavelength of 365 nm was irradiated to the PET film surface with a light amount of 5,000 mJ/cm². After the curing was completed, the release film was removed and semi-embedded and an hydrochloric acid and iron chloride-based etchant was sprayed to the surface of the embedded pattern film in order to remove the blackening layer from the surface of the second metal foil pattern of which the upper portion was exposed. The blackening layer on the light emitting device mounted portion was removed at the room temperature process within 10 seconds to manufacture the embedded metal pattern film.

A refractive index of the manufactured adhesive layer was 1.48 and tenpoint average roughness (Rz) of the surface of the first metal foil pattern facing the PET was 1.63 to 2.54 μm. Further, a line width of the first metal foil pattern was 20 μm, a pitch was 300 μm, and a thickness was 8 μm and the line width of the second metal foil pattern was 500 μm.

Example 2

In Example 1, Example 2 was performed similarly to Example 1 except that the thickness of the adhesive layer was 30 μm.

Example 3

Except that a common electrode wiring portion pattern of the first metal foil pattern was adjusted to have a rectangular block shape in which the pitch was 400 μm on a long axis and 200 μm on a short axis in Example 1, Example 3 was performed similarly to Example 1.

Example 4

Example 4 was performed similarly to Example 3 except that the line width of the first metal foil pattern was approximately 30 μm in Example 3.

Example 5

Example 5 was performed similarly to Example 3 except that the line width of the first metal foil pattern was approximately 40 μm in Example 3.

Comparative Example 1

Comparative Example 1 was performed similarly to Example 1 except that a heat lamination process for embedding the metal pattern into the adhesive layer was not performed in Example 1.

Comparative Example 2

Comparative Example 2 was performed similarly to Example 1 except that a process of removing the blackening layer from the surface of the second metal foil pattern was not performed in Example 1.

Experimental Example

1) Metal Pattern Embedding Characteristic Evaluation

Embedding degrees of the metal pattern into the adhesive layer in Examples 1 and 2 were evaluated and evaluation results are illustrated in FIGS. 3A, 3B, 4A, and 4B. More specifically, FIG. 3A illustrates a result of observing bubbles of the adhesive layer in Example 1 and FIG. 3B illustrates a result of observing a cross portion of the metal pattern and no bubble was not generated in the adhesive layer and it could be seen that the first metal foil pattern had an embedding degree of 90% into the adhesive layer. Further, FIG. 4A illustrates a result of observing bubbles of the adhesive layer in Example 2 and FIG. 4B illustrates a result of observing the cross portion of the metal pattern and no bubble was generated in the adhesive layer and it could be seen that the first metal foil pattern had the embedding degree of 99% into the adhesive layer.

In addition, embedding degrees of the metal pattern into the adhesive layer in Examples 3 and 4 and Example 5 were evaluated and the evaluation results are illustrated in FIGS. 11 to 13. More specifically, FIG. 11 illustrates a result of observing a shape of the wiring portion electrode of Example 3 and it could be seen that the wiring portion electrode had an embedding degree of 95% into the adhesive layer. Further, FIG. 12 illustrates a result of observing the shape of the wiring portion electrode of Example 4 and it could be seen that the adhesive layer had an embedding degree of 90%. In addition, FIG. 13 illustrates a result of observing the shape of the wiring portion electrode of Example 5 and it could be seen that the wiring portion electrode had an embedding degree of 85% into the adhesive layer. Therefore, in order for the first metal foil pattern to have an embedding degree of 90% or more into the adhesive layer, it is more preferable that the line width of the first metal foil pattern is 30 μm or less.

2) Comparison of Durability of Metal Pattern by External Force

Durability of the metal patterns by external force in Example 1 and Comparative Example 1 was compared. The durability was compared by a method for measuring pencil hardness under a condition of a weight of 500 g, a speed of 300 mm/s, and a distance of 15 mm. Whether the metal pattern disposed in a vertical direction was deformed and blasted was determined according to the pencil hardness and the result is illustrated in FIGS. 5A-5C and 6A-6C.

More specifically, FIGS. 5A-5C illustrate a result according to Example 1 and the metal pattern was not deformed or blasted in the case of all of pencil hardness of 4B (FIG. 5A), 2B (FIG. 5B), and HB (FIG. 5C). Further, FIGS. 6A-6C illustrates a result according to Comparative Example 1 and the metal pattern was deformed or blasted in the case of all of pencil hardness of 4B (FIG. 6A), 2B (FIG. 6B), and HB (FIG. 6C).

3) Solder Material Reflow Characteristic Evaluation

In respect to Example 1 and Comparative Example 2, a solder material reflow characteristic depending on whether to remove the blackening layer from the light emitting device mounted portion was evaluated and the result is illustrated in FIGS. 7A-7C and 8A-8C.

More specifically, FIGS. 7A, 7B and 7C illustrate the result according to Example 1, and FIGS. 8A, 8B and 8C illustrate the result according to Comparative Example 2.

Like the result, according to an embodiment of this application, since a metal foil pattern is formed by using a low-cost metal foil, raw material cost can be saved at the time of manufacturing an electrode substrate for a transparent light emitting device display. In particular, according to an embodiment of this application, the metal foil pattern is formed on an adhesive layer and then heat-treated at a temperature of 70° C. to 100° C. to manufacture an embedded electrode substrate in which the metal foil pattern is embedded in the adhesive layer.

Further, according to an embodiment of this application, the metal foil pattern is formed on the adhesive layer and then heat-treated at the temperature of 70° C. to 100° C. to prevent haze of an electrode substrate depending on illuminance of the surface of the metal foil from being increased.

In addition, according to an embodiment of this application, since a blackening layer is provided on both an upper surface and a side surface of a first metal foil pattern of a wiring electrode portion, visibility of the embedded electrode substrate for the transparent light emitting device display can be reduced.

Further, since the blackening layer is provided only on both the upper surface and the side surface of the first metal foil pattern of the wiring electrode portion and is not provided on the upper surface of a second metal foil pattern of a light emitting device mounted portion, an attachment force of a solder provided on the light emitting device mounted portion is maintained at the time of manufacturing the transparent light emitting device display.

The invention claimed is:

1. An embedded electrode substrate for a transparent light emitting device display, comprising:
   a transparent substrate;
   an adhesive layer provided on the transparent substrate; and
   a wiring electrode portion and a light emitting device mounted portion embedded in the adhesive layer,
   wherein the wiring electrode portion comprises a first metal foil pattern and comprises a blackening layer on both an upper surface and a side surface of the first metal foil pattern, and
   the light emitting device mounted portion comprises a second metal foil pattern and comprises the blackening layer only on the side surface of the second metal foil pattern.

2. The embedded electrode substrate of claim 1, wherein the thickness of the adhesive layer is 2.5 times or more larger than the thickness of the first metal foil pattern.

3. The embedded electrode substrate of claim 1, wherein the adhesive layer comprises a silane-modified epoxy resin, a bisphenol A type phenoxy resin, an initiator and a silane coupling agent.

4. The embedded electrode substrate of claim 1, wherein a tenpoint average roughness Rz of a surface of the first metal foil pattern facing the transparent substrate is more than 0.5 μm.

5. The embedded electrode substrate of claim 1, wherein a line width of the first metal foil pattern is 50 μm or less, a pitch is 100 μm to 1,000 μm, and a thickness is 3 μm to 20 μm.

6. The embedded electrode substrate of claim 1, wherein the line width of the first metal foil pattern is 30 μm or less,
the first metal foil pattern has an embedding degree of 90% or more into the adhesive layer, and
the embedding degree means a ratio of an upper area of the first metal foil pattern embedded in the adhesive layer based on the entire upper area of the first metal foil pattern.

7. The embedded electrode substrate of claim 1, wherein the first metal foil pattern and the second metal foil pattern comprise a copper foil pattern or an aluminum foil pattern.

8. The embedded electrode substrate of claim 1, wherein the wiring electrode portion comprises a first common electrode wiring portion, a second common electrode wiring portion, and a signal electrode wiring portion.

9. The embedded electrode substrate of claim 8, wherein each of the first common electrode wiring portion, the second common electrode wiring portion, and the signal electrode wiring portion comprises the first metal foil pattern,
the first metal foil patterns of the first common electrode wiring portion, the second common electrode wiring portion, and the signal electrode wiring portion are respectively separated from each other by a disconnection portion, and
a width of the disconnection portion is 80 μm or less.

10. The embedded electrode substrate of claim 9, wherein the light emitting device mounted portion comprises at least four electrode pad portions electrically connected to the first common electrode wiring portion, the second common electrode wiring portion, and the signal electrode wiring portion.

11. The embedded electrode substrate of claim 10, wherein the at least four electrode pad portions comprise two signal electrode pad portions, one first common electrode pad portion, and one second common electrode pad portion.

12. A transparent light emitting device display comprising:
an embedded electrode substrate for a transparent light emitting device display of claim 1.

13. A method for manufacturing an embedded electrode substrate for a transparent light emitting device display, the method comprising:
forming a structure comprising a transparent substrate, an adhesive layer provided on the transparent substrate, and a metal foil provided on the adhesive layer;
forming a wiring electrode portion comprising a first metal foil pattern and a light emitting device mounted portion comprising a second metal foil pattern by patterning the metal foil;
forming a blackening layer on both upper surfaces and side surfaces of the first and second metal foil patterns;
embedding the first and second metal foil patterns into the adhesive layer by heat-treating a structure comprising the blackening layer at a temperature of 70° C. to 100° C. and exposing the upper surface of the second metal foil pattern; and
removing the blackening layer provided on the upper surface of the second metal foil pattern.

14. The method of claim 13, wherein the forming of the structure comprising the adhesive layer provided on the transparent substrate and the metal foil provided on the adhesive layer comprises:
forming the adhesive layer on the metal foil and forming the transparent substrate on the adhesive layer, or
forming the adhesive layer on the transparent substrate and forming the metal foil on the adhesive layer.

15. The method of claim 13, wherein a tenpoint average roughness (Rz) of the surface of the adhesive layer before the heat treating is more than 0.5 μm, and
the tenpoint average roughness (Rz) of the surface of the adhesive layer after the heat treating is 0.1 μm or less.

16. The method of claim 13, wherein the forming of the blackening layer is performed by a plating process using a plating solution comprising at least one of copper, selenium, cobalt, nickel, manganese, magnesium, sodium, oxides thereof, and hydroxides thereof.

* * * * *